US006400128B2

(12) United States Patent
Guidotti et al.

(10) Patent No.: US 6,400,128 B2
(45) Date of Patent: Jun. 4, 2002

(54) THERMAL MODULATION SYSTEM AND METHOD FOR LOCATING A CIRCUIT DEFECT

(75) Inventors: Daniel Guidotti, Yorktown Heights; Arnold Halperin, Cortlandt Manor; Michael E. Scaman, Goshen; Arthur R. Zingher, White Plains, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/811,884

(22) Filed: Mar. 19, 2001

Related U.S. Application Data

(63) Continuation of application No. 09/325,472, filed on Jun. 3, 1999, now Pat. No. 6,236,196.

(51) Int. Cl.[7] ............................ G01R 31/02; G02F 1/00; H04N 7/18; H03L 7/00
(52) U.S. Cl. .................. 324/73.1; 324/752; 324/158.1; 324/537; 250/492
(58) Field of Search ................................ 324/73.1, 521, 324/71.1, 752, 158.1, 537, 765; 250/332, 559.07, 492.2, 492

(56) References Cited

U.S. PATENT DOCUMENTS

| 4,760,265 A | 7/1988 | Toshida et al. | 250/492.2 |
| 5,430,305 A | 7/1995 | Cole, Jr. et al. | 250/559.07 |
| 5,440,566 A | 8/1995 | Spence et al. | 374/41 |

(List continued on next page.)

OTHER PUBLICATIONS

"Quick Inspection of Power–Plane Short Fault on Multilayer Substrate", by Fang–Lin Chao, et al., IEEE Transactions on Components, Packaging, and Manufacturing Technology, Part A, vol. 18, No. 3, Sep. 1995, pp. 466–470.

"Latent Open Defect Detection Using Phase–Sensitive Nonlinearity Detection Technique", by Arnold Halperin, et al., IEEE Transactions on Components, Packaging, and Manufacturing Technology, Part B, vol. 18, No. 2, May 1995, pp. 358–365.

"Backside Localization of Open and Shorted IC Interconnections", by Edward I. Cole, Jr., et al., IEEE 98CH36173, 36th Annual International Reliability Physics Symposium, Nevada, 1998, pp. 129–136.

"Infrared Scanning for Hot Spots Increases Power Efficiency in Producing High Purity Copper Sheet", by Jackson Jenkins, et al., Industrial Heating, Dec. 1993, pp. 39–43.

*Primary Examiner*—N. Le
*Assistant Examiner*—Wasseem H. Hamdan
(74) *Attorney, Agent, or Firm*—Scully, Scott, Murphy & Presser; Steven Capella, Esq.

(57) ABSTRACT

A system and method for locating a circuit defect, such as a short or an incipient open, in an electric circuit in a workpiece, such a Printed Circuit Board (PCB) or MultiChip Module (MCM). The circuit is connected to a device for sensitively measuring any resistance change. A thermal stimulus is applied to various subsets of the surface of the workpiece, the thermal stimulus being temporally modulated, and the resistance change measurement correlated with this modulation. By applying well-designed thermal stimulus subsets, resistance measurements may be logically combined which correspond to the plural thermal stimulus subsets. Further, the search region where the defect may be located may be iteratively refined. By measuring the time delay between the thermal stimulus and corresponding resistance change, the depth of a defect below the surface of the workpiece is further determined. Thus the system and method efficiently and accurately locates a defect in three dimensions, even if the workpiece is large, and the defect is small and underneath the surface.

17 Claims, 9 Drawing Sheets

U.S. PATENT DOCUMENTS

| | | | |
|---|---|---|---|
| 5,469,051 A | 11/1995 | Yarmchuk | 324/158.1 |
| 5,502,001 A | 3/1996 | Okamoto | 438/798 |
| 5,502,390 A | 3/1996 | Olsen | 324/537 |
| 5,568,055 A | 10/1996 | Olsen | 324/718 |
| 5,594,248 A | 1/1997 | Tanaka | 250/332 |
| 5,747,999 A | 5/1998 | Yamaoka | 324/501 |
| 5,821,759 A | 10/1998 | Scaman et al. | 324/529 |
| 6,078,183 A | 6/2000 | Cole, Jr. | 324/752 |
| 6,141,093 A | 10/2000 | Argyle et al. | 324/529 |
| 6,242,923 B1 | 6/2001 | Scaman et al. | 356/237.1 |

Thermal Stimulus Pattern
1mm × 16mm

Thermal Stimulus Pattern
16mm × 1mm

THERMAL MODULATION SYSTEM AND METHOD FOR LOCATING A CIRCUIT DEFECT

CROSS-REFERENCE TO RELATED APPLICATIONS

This application is a continuation application of commonly owned, co-pending U.S. patent application Ser. No. 09/325,472 filed Jun. 3, 1999.

This application is a continuation application of commonly owned U.S. Pat. No. 6,236,196 B1, issued May 22, 2001.

BACKGROUND OF THE INVENTION

1. Field of the Invention

The present invention relates generally to testing of an electric workpiece including at least one electrical circuit provided on a substrate, printed circuit board, multi-chip module, and the like, and, particularly, to a system and method employing a thermal stimulus to a circuit for efficiently and accurately locating a defect, e.g., a short circuit or an incipient open circuit, which can be practiced in the absence of a priori knowledge of circuit geometry, and which uses electrical access only at circuit terminals.

2. Discussion of the Prior Art

It is often required to fabricate an electric workpiece including one or more electrical circuits, composed of suitable electrically conducting material conduits to carry either power or signal to and from various locations in electrical circuit structures.

These circuits may be either in the same plane, or may be in various planes stacked one over the other. Suitable electrical insulator materials separate these planes, in addition to separating the electrical conduits within a network. Electrical connections among conducting circuits in various planes are made through "vias" which perpendicularly connect plural planes. Some examples of an electric workpiece are: a printed circuit board, an electronic substrate, a multi-chip module, a flexible printed circuit sheet, etc.

During fabrication of an electric workpiece, it is possible that unwanted short circuit connections may inadvertently result, such as a short circuit or an incipient open circuit. These circuit defects may have a wide range of electrical resistance. Often, these defects must be located precisely for evaluation, analysis and possible repair. Incipient defects are unstable structures which may become either a short circuit or an open circuit condition at some time in the future. Incipient open circuits may be caused by a narrow neck in a circuit line, or chemical contamination. These defects may be detected by harmonic response analysis means disclosed by DiStefano, et al. in U.S. Pat. Nos. 4,496,900 and 4,868,506. Incipient open defect detection is also described by Halperin, DiStefano and Chiang in "Latent Open Defect Detection Using Phase-Sensitive Nonlinearity Detection Technique", IEEE Transactions on Components, Packaging and Manufacturing, Part B, Vol. 18, No. 2, May 1995, pp. 358. As described in this reference, a circuit is driven with a modulated current, and a circuit defect is detected with electric non-linearity. For example, in a circuit driven with current at two frequencies Fdrive1 and Fdrive2, the circuit defect generates a heterodyne modulation at a frequency.

In another example, a large current at Fdrive2=0 is passed through the circuit under test and the defect generates a homodyne modulation at a frequency.

There are several prior techniques to locate a short circuit defect including (1) human visual inspection or robotic pattern recognition. Other techniques apply a sufficient alternating current (AC) through two circuits connected by an inadvertent short, thus, generating a local magnetic field at the point where the short circuit occurs. This short circuit may be located by a technique (2) which requires scanning with a small non-contacting loop and measuring the induced Electromagnetic Field (emf). In another prior art technique (3), a thin film of a material having a suitably high magnetic susceptibility is applied to the workpiece. Adjacent to the short circuit, the magnetic field induces optical birefringence in the magnetic material. Under optical inspection with polarized light, the location of the defect may be determined. In yet another prior art technique (4), an AC current is applied to a small loop of wire. When the loop is near the short, the AC magnetic field induces a current to flow between two shorted circuits, thus indicating the proximity to the location of the defect.

The problem with method (1) is fatigue and unreliability, if human inspection is used; unreliable pattern recognition due to topography and transparent insulating films if robotic inspection is used.

Methods (2) (3) (4) are essentially spot scanning methods and require a long search time to locate a defect which might be anywhere in a search region. Inconveniently, long search times occur in several important cases: for short circuits between power planes, for defects involving one or more wires whose path geometry is effectively not known, or for complex printed circuit boards. To locate a defect in three dimensions, such as in a printed circuit with many layers, becomes even more difficult.

By contrast, if a defect is somewhere along a known path, which is topologically one-dimensional, and if it is practical to search narrowly along this path, then it is much less difficult to locate the defect. However, this favorable situation often does not occur for shorts, and does not occur for a workpiece without a detailed circuit map.

A further problem with methods (2), (3) and (4) is loss of reliability when the shorting resistance is greater than 1 kOhms.

A further problem with methods (2), (3) and (4) is false positives which indicate the presence of a circuit shorting defect where there is none. These false positives originate from certain circuit features such as input and output connections, inter-plane connections and depend on circuit design.

A recurring problem for electronic printed circuit board (PCB) and multi-chip module (MCM) substrate fabrication is the inability to locate efficiently and accurately short defects or incipient open defects. The ability to effectively locate defects in complex network of electrical conductors has important consequences; once a defect is located and carefully analyzed, the resulting information often helps to improve manufacturing technique and manufacturing yield.

The act of spatially locating a defect is very different from the act of detecting the same defect. These defects often are simple to detect, using just an ohmmeter. However, a short circuit defect between two power planes may occur almost anywhere on the workpiece region where the two power planes come near each other, so such a defect is often very challenging to locate. Alternatives such as automated optical inspection (AOI) may have some level of effectiveness. Unfortunately, however, AOI often is very time consuming, and often misses some defects. Therefore, other techniques are often necessary.

A first prior art technique for locating a short circuit defect is referred to as a voltage gradient technique, such as described in the reference "Quick Inspection of Power Plane Short Fault on Multilayer Substrates," IEEE Transactions Comp. Packaging and Manufacturing Technology, USA, Vol. 18, No.3, September 1995, pp. 466–470 by Fang Lin Chao et al. This technique requires mechanical probe contact with the top surface metallurgy (TSM) and may be neither practical nor desirable. Non-contact methods of probing the surface are much more desirable.

A second technique utilizes magnetic induction, such as shown and described in U.S. Pat. No. 5,821,759 entitled "METHOD AND APPARATUS FOR DETECTING SHORTS IN A MULTI-LAYER ELECTRONIC PACKAGE," commonly-owned by the assignee of the present invention. In particular, Faraday induction techniques which typically use an AC pickup coil, are described in commonly-owned, U.S. Pat. No. 6,242,923 B1 entitled "METHOD FOR DETECTING POWER PLANE-TO-POWER PLANE SHORTS AND I/O NET-TO-POWER PLANE SHORTS IN MODULES AND PRINTED CIRCUIT BOARDS." Faraday induction is often used effectively for low resistance shorts. However, Faraday induction is much less effective for high resistance shorts, particularly in the presence of significant capacitive coupling between power planes.

A third technique involves covering the printed circuit board surface with iron garnet, or another magneto-optical material, and inspecting this material with polarized light. A local magnetic field changes the polarization of reflected light. This method is shown and described in commonly-owned, U.S. Pat. No. 6,141,093 entitled "METHOD AND APPARATUS FOR LOCATING POWER PLANE SHORTS USING POLARIZED LIGHT MICROSCOPY." Although this method has been used effectively, unfortunately, it tends to require fairly high current through the shorts to produce sufficiently high magnetic fields to image the defect using polarization techniques.

A fourth technique implements infrared optical emission such as described in the reference "Infrared Scanning for Hot Spots Increases Power Efficiency in producing High Purity Copper Sheet," Industrial Heating, v. 60, Dec. 12, 1993, p. 39 to Jackson Jenkins et al. Infrared optical emission has often been used to find power plane shorts but it requires the defect to be fairly low resistance in order to generate sufficient heat. This technique is thus marginal to detect high resistance defects.

A fifth technique uses laser scanning for locating shorts, e.g., using the Seebeck effect, such as shown and described in "Backside Localization of Open and Shorted IC Interconnections," IEEE International Reliability Physics Symposium, 1998, pp. 129–36, March–April 1998 to E. I. Cole Jr. et al.

Alternately, in a sixth technique, the short circuit may be blown using a current stress technique, e.g., blowing high resistance sorts with a low current/high voltage spike or blowing low resistance shorts with a high current/low voltage DC. However, this may be excessively destructive and may not help to locate the defect for diagnostics.

Of the prior art techniques described above, the first is applicable to high resistance shorts, but is undesirable because it requires probing along a conducting line and is thus slow, limited to the top surface and may be regarded as destructive in some applications. The second, third and fourth techniques are applicable only to low resistance shorts of less than 1 kOhm. The fifth technique, while based on general physical principles, is most suitably applied to test sites in semiconductors as it relies on the Seebek effect to vary the bias conditions of an integrated transistor that forms part of its detection method. The sixth prior art technique is destructive and can only be applied once for each short circuit defect.

The first and fifth prior art techniques further require knowledge of the circuit path and geometry. While the second and third techniques do not require knowledge of circuit path geometry, these are rather slow spot scan methods, and further, are applicable only for defect shorts having a resistance of less than 1 kOhm. The fourth technique does not require knowledge of circuit line geometry, but, as discussed above, is also applicable only for defect shorts having a resistance of less than 1 kOhm. The sixth technique does not require knowledge of circuit line geometry and is applicable to low and high resistance short circuit defects. Unfortunately, the sixth technique typically destroys the defect and its immediate neighborhood, which largely prevents further detailed analysis.

It would be highly desirable to provide a non-destructive means of rapidly locating unwanted resistive connections between a plurality of electrically isolated conductors and a power plane, or between two isolated electrical circuits or between two power planes, without prior knowledge of circuit lines geometry.

SUMMARY OF THE INVENTION

It is an object of the present invention to provide a system and method for locating circuit defects in an electric workpiece by a thermal stimulus, such as infrared light, which efficiently surveys over an entire area of electrical circuits and insulating materials without requiring prior knowledge of circuit line geometry.

It is a further object of the invention to provide a system and method to locate circuit defects by way of electrical access at the terminals of the circuit structures, without requiring electrical access along the circuit structures.

Still a further object invention is to provide a system and method capable of efficiently and accurately locating a circuit defect anywhere in a "search region" of an electric workpiece. In the default case, the search region includes the entire surface of the workpiece. In other cases, the original search region may be smaller, because the circuit is restricted to some part of the workpiece. According to the invention, circuit defects include, but are not limited to the following: a "short" defect, i.e., an unintended electrical connection, e.g. formed between plural circuit elements which otherwise would be unconnected; and, an "incipient open" defect which is typically an unintended resistive zone interposed in an otherwise conductive circuit. This resistive zone typically may be caused by abnormal geometry, or a crack, or abnormal material properties, or many other reasons. It is valuable to locate a defect, in order to analyze its structure and diagnose its cause, so that fabrication quality may be improved.

Another object of the invention is to provide a system and method for locating circuit defects having resistance values ranging anywhere between 0.1 Ohms to 100 MegaOhms.

Still another object of the invention is to provide a system and method to locate an unwanted resistive connection between distinct circuits in an electric workpiece, and locate an otherwise unwanted resistive intrusion in an otherwise electro-conductive circuit.

Yet still a further object of the invention is to provide a system and method to locate the depth of a circuit defect that exists significantly under the surface of the workpiece, e.g., printed circuit board, etc. Thus, insofar as the workpiece is three-dimensional, the present invention locates the defect in three dimensions.

According to the principles of the invention, there is provided a system and method for locating an unwanted circuit defect in an electric workpiece having an electric circuit including the circuit defect. The system comprises: a means for thermally stimulating subsets of a search region defined for said workpiece; a means for measuring corresponding changes in the electric resistance of the electric circuit; and, a means for determining the location of the defect according to the stimulus subsets and the corresponding measurements, wherein one or more of the stimulus subsets includes one possible location for the defect.

According to the preferred embodiments, the invention functions in accordance with the following principles: (1) Given a workpiece with an electric circuit which may have a circuit defect at an unknown location within a search region with many possible locations, the defect is efficiently and accurately located; (2) A circuit defect typically includes a resistive zone. When the zone changes temperature, its resistance changes slightly. When this is part of a circuit, the overall circuit resistance changes slightly. By contrast, for a perfect circuit, the resistance is much less sensitive to local temperature; (3) The relatively small resistance changes are more easily measured by using a time-modulated stimulus, and an AC-coupled resistance meter which is phase-locked to the stimulus; (4) By applying a thermal stimulus to a location on the surface of the workpiece, if a circuit defect is nearby, there will be a corresponding change in circuit resistance. Conversely, the presence or absence of a corresponding resistance change indicates the presence or absence of a nearby defect; (5) When a thermal stimulus is applied on the surface of the workpiece, and a defect is under the surface, heat will diffuse down to the defect and will require some time delay, typically proportional to the square root of the depth. Conversely, by measuring the delay, the depth may be inferred; (6) Given a thermal stimulus applied to a subset (or pattern) containing many locations, the presence or absence of a corresponding resistance change indicates the presence or absence of a defect adjacent to this subset of locations. Thus many locations may be simultaneously tested; (7) Considering plural distinct subsets and corresponding measurements which indicate that some subsets contain at least one defect, and others do not contain a defect, the search region may be refined (or concentrated) according to earlier subsets which indicated some defect(s) in order to more closely locate the defect(s); (8) For a circuit which has exactly one defect, if plural subsets and corresponding measurements indicate that each subset contains at least one defect on this circuit, then the defect is located at the intersection of these subsets. Thus, plural subsets and corresponding measurements may be logically combined to more tightly locate the defect. By using additional stimulus subsets and measurements, multiple defects may be located.

Advantageously, this invention does not require visual inspection and requires electrical access only at the terminals of the circuits in question. The technique can be automated to scan circuits imbedded in thick, electrically insulating ceramic materials as well as in stacks of conducting circuits isolated by thin films of organic electrically insulating materials. Furthermore, the system and method of the invention enables fine spatial resolution, rapid and safe operation, convenient automation, economical capital and operating costs, and compatibility with delicate thin film wiring and compatibility with multi-layer wiring.

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENTS OF THE INVENTION

Figure 1:
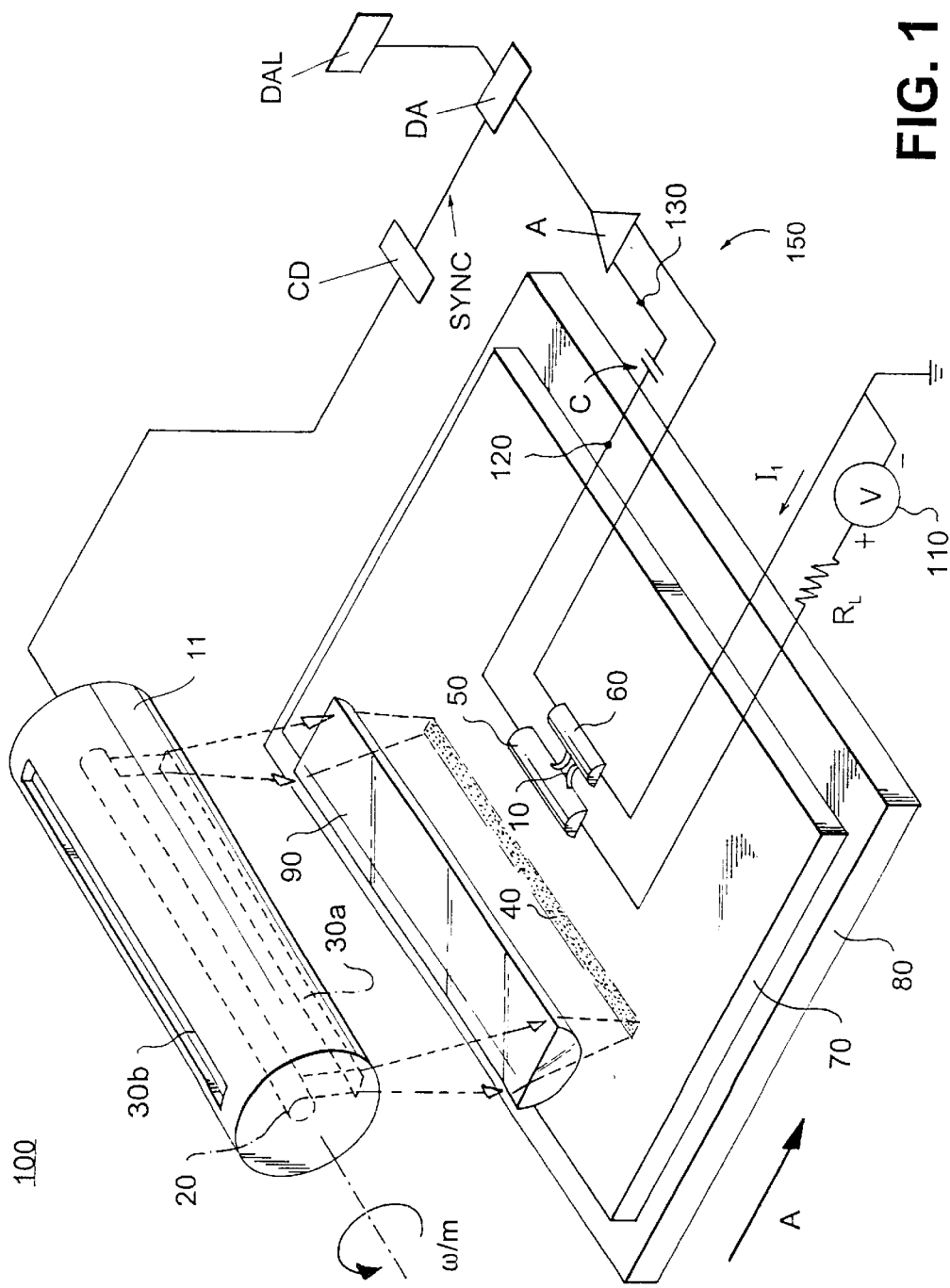
FIG. 1 illustrates the thermal modulation system and method to locate a short circuit defect according to a first embodiment that implements application of a thermal stimulus in a long narrow pattern, and is temporally modulated.

The transport of electrical charge through a material is generally characterized by a resistance (R) whose dependence on material temperature (T) is generally expressed empirically as shown in equation (1):

$$R = R(T_o)[1 + a_1(T-T_o) + a_2(T-T_o)^2 \ldots] \qquad (1)$$

Here R(T) is the resistance at temperature T, and $T_0$ is a reference temperature. Also, $a_1$, $a_2$, et cetera, are empirical parameters that characterize the dependence of R on sample temperature.

When a time-dependent thermal stimulus is applied to a portion of an electrical conductor, the thermal stimulus modulates the local temperature which modulates the local resistance of the conductor material, which modulates the overall resistance of the circuit. The corresponding time-dependence of electrical resistance may be measured with a suitable electronic meter.

In the invention, a spatially localized thermal stimulus is applied to a work piece, e.g., PCB, MCM, and the corresponding resistance change is measured. A number of electrical detection circuits and various means of applying time-dependent temperature variations to a material or a portion thereof according to the invention will now be described by way of examples of the various embodiments.

In a representative embodiment, the following operations are implemented:

1. Application of a time dependent thermal stimulus to a subset of a search region on the surface of the workpiece. For example, a long narrow pattern of modulated infrared light is applied to the workpiece.
2. Measurement of a corresponding change in circuit resistance. For example, a constant current is applied to the workpiece circuit and time dependent voltage changes are measured with a lock-in detector phase-locked to the modulation.
3. Change the search region to a different subset, and repeat the preceding operations (1) and (2). In some embodiments, the stimulus stays fixed, and the workpiece is moved. In other embodiments, the stimulus subset changes position, or size, or shape; and,
4. In some embodiments, earlier thermal stimulation subsets and corresponding measurements are analyzed and used to design subsequent thermal stimulus subsets. That is, the search region is iteratively refined, to successively narrow down the location of a defect.

Consider a workpiece including a circuit element which includes a circuit defect, particularly one with a small resistive zone. When the stimulus is near the circuit defect, its resistance is modulated principally at the same frequency as the thermal stimulus, thereby indicating the location of the circuit defect. When the thermal stimulus subset is far from the circuit defect, the resistance shows almost no modulation. In one embodiment, the resistance modulation is measured, with suitable circuitry, as a function the thermal stimulus subset, including its pattern, orientation and position. The circuit defect may have a wide range of electrical resistance values e.g., ranging between 0.1 Ohm and 100 M Ohm, and the resistance variation is proportional to this circuit defect resistance. It should be understood that a circuit element may include a printed wire, a power plane, a ground plane, or haze layer, and, more generally, may include an AC shield, a printed antenna, or any conductive or resistive structure.

According to the first embodiment of the invention as shown in FIG. 1, a narrow line segment 40 of incident radiant energy is applied over the entire length of a work piece at the same time and provides periodic heating over its entire length. When the thermal stimulus line segment overlaps with a circuit defect, somewhere in the workpiece, the circuit defect is periodically heated and the corresponding resistance change is measured and recorded. A long, narrow pattern of thermal stimulation reduces the time required to probe the entire workpiece, as will hereinafter be described in greater detail.

According to a first embodiment, FIG. 1 illustrates an apparatus 100 for thermally stimulating selected subsets of work piece 70 and measuring any corresponding change in circuit resistance. As shown in FIG. 1, a linear source of constant radiant energy 20, e.g., infrared radiation, is positioned within a hollow, slotted, rotating circular cylinder 11. This cylinder has "m" slot openings, for example, slot openings 30a, and 30b, and elsewhere blocks incident radiation from linear source 20. A cylindrical lens light concentrator 90 focuses the periodically incident radiant energy from the linear source 20 through a slot opening in cylinder 11 onto a narrow, line segment of concentrated radiant energy 40 that is incident on workpiece 70 containing circuit defect 10 between conductors 50 and 60. As the slotted cylinder 11 turns at frequency ω, it periodically modulates the radiant energy from the linear source 20. For conductors 50 and 60 in series, a representative total resistance is, for example, 2 Ohms.

Suitable sources of radiant energy may include, by way of example and not limited to, the following categories: lasers, masers, incandescent or halogen lamps, millimeter-range electromagnetic radiation, near infrared and far infrared glowers, gaseous plasma discharge lamps such as Xenon, Neon, or Mercury. In many cases, incandescent or halogen lamps are preferred because they are cheaper and safer alternatives.

One embodiment uses a long narrow thermal stimulus 40. The work piece 70 is positioned on a movable stage 80 and is moved at a constant rate in a first direction A, which is the X-direction of the workpiece. Thus, an X-coordinate(s) may be found for any unwanted defect that is detected. Then, the workpiece 70 is rotated by 90°, and the platform 80 (workpiece 70) is again moved at a constant rate along direction A which is now the Y-direction of the workpiece. Thus the Y-coordinate(s) of the unwanted resistive defect(s) may be located. The rate at which the work piece is moved depends upon the workpiece type, e.g., PCB or MCM, its thickness and wiring complexity, and the amplitude, modulation frequency, and the area of the thermal stimulus 40 being applied. It should also be understood that the work piece may remain stationary while the entire source of modulated thermal stimulus (source 20, chopper 11 and concentrator 90 are rigidly moved together. Again, the thermal stimulus is scanned in two directions, which together locate both X and Y coordinates for a defect.

As further shown in FIG. 1, suitable circuitry 150 is provided for measuring the corresponding resistance changes. A constant current source or constant voltage source 110 with a series resistor $R_L$ is connected to the terminals of the relevant circuit in the work piece (the resistor $R_L$ preferably is of a value in the range of the circuit resistance in order to maximize the signal sensitivity). Thermal modulation of the defect resistance 10 causes an alternating voltage between the two conducting elements 50 and 60 of the workpiece. A coupling capacitor (C) connects the output of a first conducting element to an amplifier (A), and thus separates resistance changes from the constant baseline resistance. Amplifier (A) drives a data acquisition instrument (DA), for example, a lock-in amplifier when making frequency domain measurements (FIG. 3), or a box car integrator or wave form digitizer for time domain measurements (FIG. 4). This drives a data analyzer and logger device (DAL) such as an analog-to-digital converter, computer and data analysis software. In addition, a chopper driver (CD) is provided which drives the rotating cylinder and drives a synchronization signal (SYNC) into the DA lock-in amplifier, etc.

According to the invention of FIG. 1, the average conducting element resistance of the unwanted short circuit defect is R before the modulated thermal stimulus 40 is applied to the workpiece 70. When this thermal stimulus is adjacent to the circuit defect 10, it has a periodic temperature change ΔT(t), and a corresponding periodic change ΔR(t).

For example, a thermal stimulus of visible light with power fluence of 1 W/cm² modulated at a frequency of 30 Hz, for example, is applied to a 1 cm portion of two long, continuous, thin copper segment being bridged by a resistive defect having a total resistance of 2 Ohms. Thus, a root—mean—square (RMS) resistance modulation of 4×10⁴ Ohms is observed, corresponding to an RMS temperature variation of 0.05° C. in the illuminated resistive defect.

When the incident radiant power is fully amplitude modulated at angular frequency, the resistive defect 10 experiences a time—varying incident power whose magnitude may be expressed, by way of example, to first order, according to equation (2) as follows:

$$P(t) = P_0[1 + Cos(\omega t)] \tag{2}$$

Supporting the thermal line constant of the work piece is short in comparison with the modulation period $2\pi/\omega$, therefore, the temperature of the defect 10 on the workpiece is modulated approximately according to equation (3) as follows:

$$T(t)=T_0+T_1[1+Cos\{\omega(t-\tau)\}] \quad (3)$$

where $T_0$ is a constant sample temperature; $T_1$ is the peak temperature change caused by the applied thermal stimulus; and, $\tau$ is a parameter representing a time lag which depends, in large part, on the mass, the specific heat and the thermal conductivity of the resistive defect. The time lag $\tau$ also depends on the spatial separation between the resistive defect 10 and the thermal stimulus 40 on the workpiece, and on the thermal conductivity of the surrounding work piece with which heat is exchanged. For example, the circuit defect may be located at some distance below the surface of workpiece 70 while the incident power is absorbed only at the surface and only heats the surface.

Based on equations (1) and (3), the resulting resistance change in the circuit defect 10 may be approximated according to equation (4) as follows:

$$\Delta R(t)=R_0a_1\Delta T=R_0a_1T_1[1+Cos\{\omega(\tau-\tau)\}] \quad (4)$$

where $a_1$ is defined in Equation (1) and $R_0$ is the average resistance of the circuit defect 10. Based on the detection circuit 150 of FIG. 1, an example of how $\Delta R(t)$ is detected and measured, is now described. The total voltage at point 120 in the detection circuit as depicted in FIG. 1 is approximated by $V(t)=I_1R+\Delta V(t)$, where $\Delta V(t)=I_1\Delta R(t)$. At point 130, the AC voltage is approximated by Equation 5:

$$\Delta V(t)=R_0I_1a_1T_1[1+Cos\{\omega(t-\tau)\}] \quad (5)$$

The resulting net phase shifts contributed by the detection electrical circuitry 150 is substantially small and negligible when $\omega$ is less than 1 MHZ. A signal $\Delta V(t)$, substantially represented by Equation (5) is recorded when the modulated thermal stimulus 40 is adjacent to the circuit defect 10 as work piece 70 is scanned in orthogonal X and Y directions, or as the incident thermal stimulus 40 is scanned in orthogonal X and Y directions.

Figure 2:
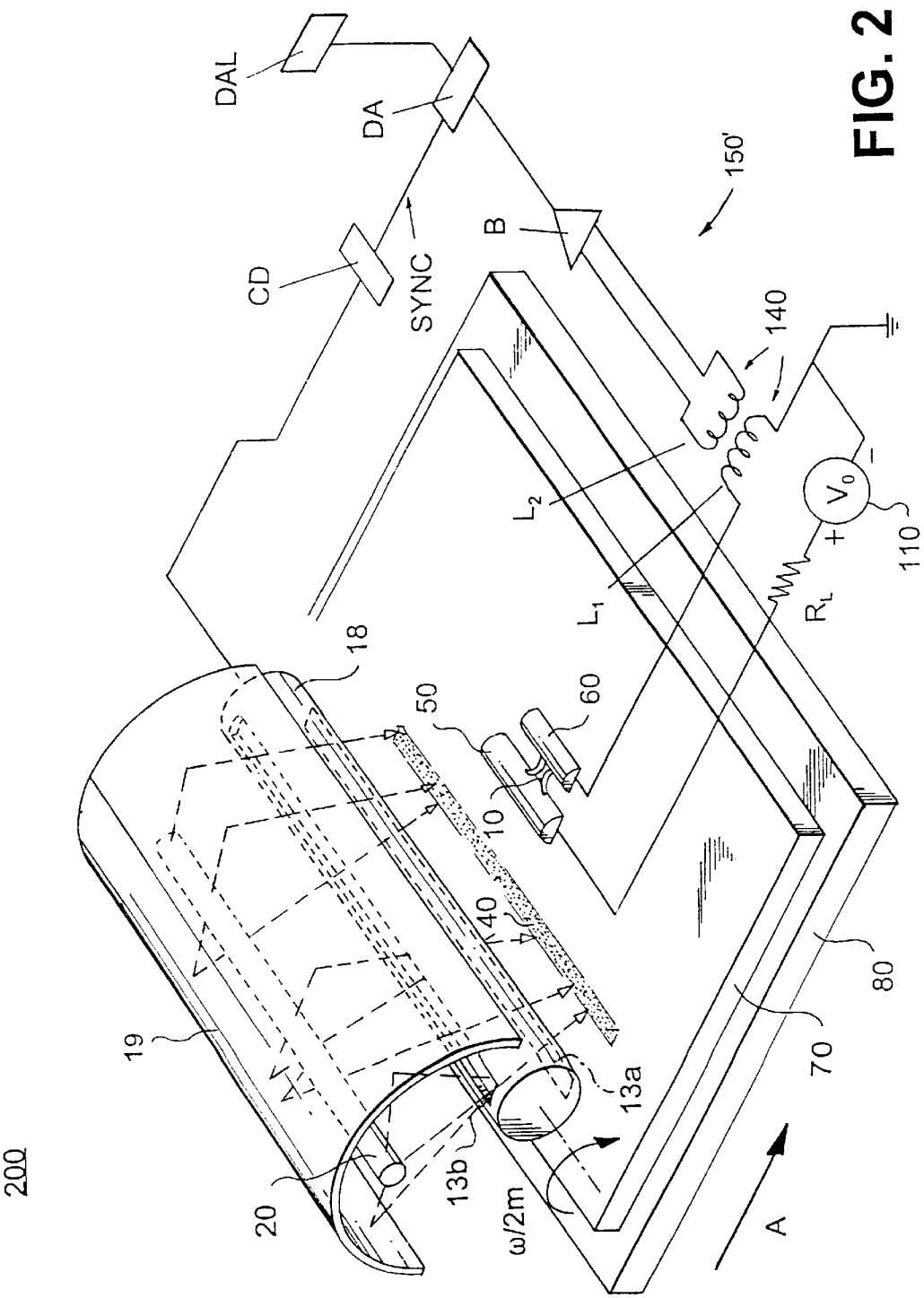
FIG. 2 illustrates the thermal modulation system and method according to a second embodiment of the invention, however, that may be implemented for locating both a short circuit defect and an incipient open defect.

FIG. 2 illustrates an apparatus 200 according to a second embodiment. The apparatus of FIG. 2 operates like the apparatus 100 described with respect to FIG. 1. However, in FIG. 2, there is an elliptical trough reflector 19 which concentrates the stimulus into a narrow pattern 40. The radiation source is at one elliptical focus, and the workpiece is at the other elliptical focus. A hollow, slotted circular cylinder 18 has "m" diametrically opposed slot openings indicated as slot openings 13a, 13b, and is blocking elsewhere for radiation emanating from source 20. Preferably, the slotted circular cylinder 18 rotates at frequency $\omega/2m$ and modulates the narrow light segment 40 to turn "ON" and "OFF" at frequency $\omega$. When thermal stimulus is applied to the resistive circuit defect 10, it produces a corresponding resistance change.

Procedures for locating the spatial position of resistive defect 10 are substantially as described in connection with the embodiment represented in FIG. 1.

In the detection circuit 150' of FIG. 2, there is provided a coupling transformer 140 with a low inductance (L1) primary winding and a higher inductance (L2) secondary winding. The current signal from L2 is amplified by low input impedance amplifier B. The remainder of the detection and data analysis system 150' is the same as that described in FIG. 1.

FIG. 2 illustrates, in addition, a different embodiment to measure thermo-resistive changes. The electrical circuit 150' of FIG. 2 employs a constant voltage source $V_0$ and measures the time-dependent current changes $\Delta I_1(t)$, due to thermo-resistive changes in the resistive zone 10 caused by the thermal stimulus 40. Furthermore, the embodiment of FIG. 2 may measure thermo-resistive changes due to a short circuit defect or due to an incipient open circuit defect. In conjunction with Equation 4, resistors $R_L$ and $R_O$ were defined previously. When the electrical impedance $Z_{ll}$ of inductor L1 satisfies the condition $Z_{ll}<<(R_L+R_O)$, then the thermo-resistive current oscillations in resistive link 10 are measured in circuit 150' and are substantially approximated by Equation (6) as follows:

$$\Delta I_1(t)=-V_0\Delta R(t)/(R_L+R_O)^2 \quad (6)$$

Figure 3:
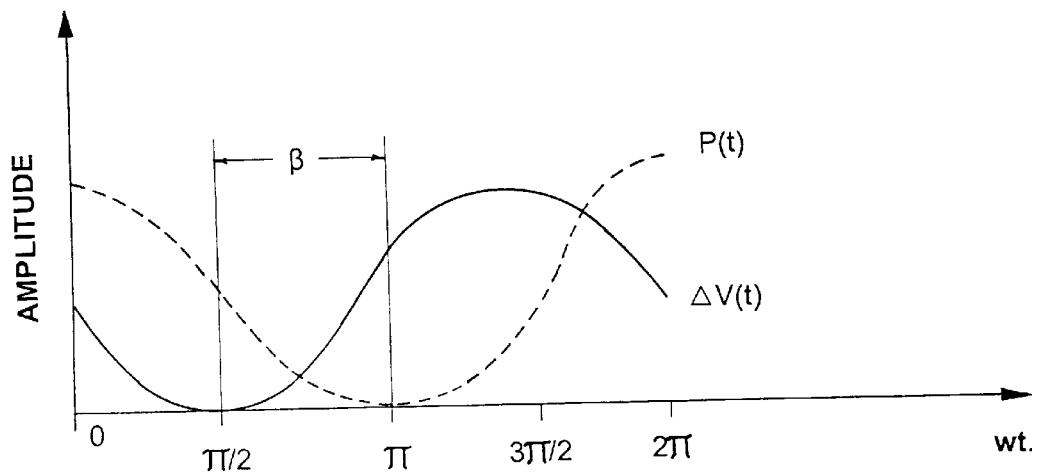
FIGS. 3 and 4 depict graphs representing how the thermal stimulus power and the resultant circuit resistance change varies versus time for a short defect between two normally isolated conductors, with FIG. 3 depicting how the thermal stimulus power varies sinusoidally, and FIG. 4 depicting how the thermal stimulus power varies as a train of rectangular pulses.
Figure 4:
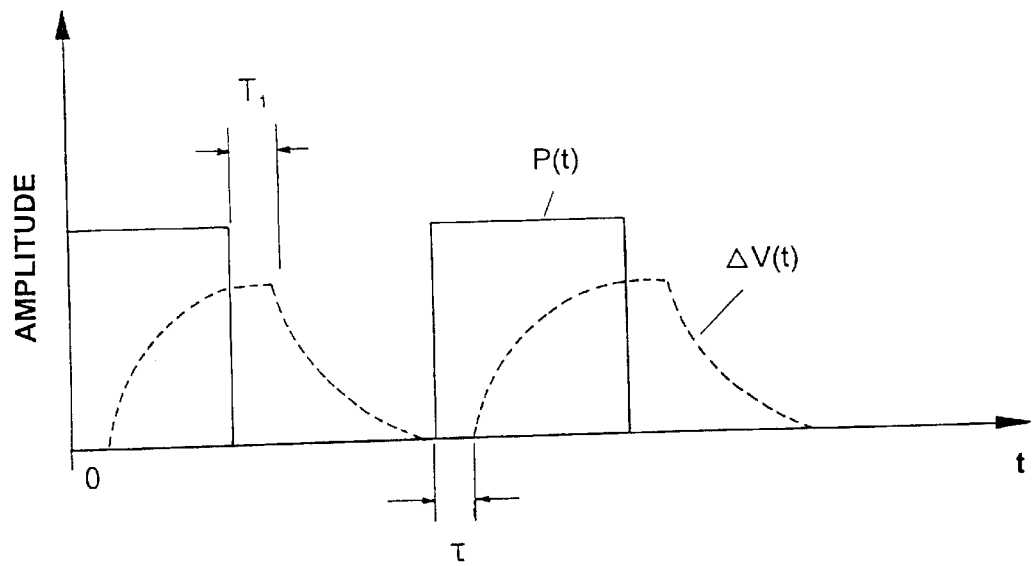

FIG. 3 shows the time dependence of a sinusoidally modulated thermal stimulus P(t) and the corresponding measured voltage $\Delta V(t)$. This is a sinusoid at frequency $\omega$ with phase lag angle $\beta=\omega\tau$. The same general features apply to the current response signal $\Delta I_1(t)$ of Equation 6 since both $\Delta V(t)$ and $\Delta I_1(t)$ are proportional to thermal-resistive changes $\Delta R(t)$ of resistive defect 10 as substantially represented by Equation 4. In the case when the resistive defect 10 is located below a surface and the incident light is absorbed at the surface and heats the surface periodically, the phase lag $\beta$ increases as the resistive zone is located deeper below the surface. It should be understood that while the phase lag $\beta$ is determined by the depth of the unwanted resistive connection, it is also affected by other factors such as the thermal conductivity of the encapsulating, electrical insulator material above the location of the unwanted connection, and the thermal heat capacity of the resistive zone 10.

It is well known in the art of one dimensional conduction of heat that when the surface temperature of a semi-infinite medium varies at angular frequency $\omega$, the amplitude of temperature oscillations in the medium decreases exponentially as distance below the surface with a characteristic decay length given by $\Lambda=\sqrt{2\kappa/\omega}$ where $\kappa=K/\rho c$ is generally known as the thermal diffusivity; K is the thermal conductivity of the medium and $\rho$ and c are respectively, its density and specific heat. In the present example, the decay length $\Lambda$ may be taken as an indicator of the detection depth; that is, the depth to which a resistive shorting defect may be detected by the time-dependent, thermal stimulus method of the invention. Of course, a greater magnitude of temperature modulation at the semi-infinite surface allows defects at greater depth to be detected. It can also be shown, in the context of one-dimensional, semi-infinite heat flow, that the time delay $\tau$ in observing the effects of a thermal stimulus on a resistive defect below a periodically heated surface due to a separation distance "l" between the heated surface and the resistive defect, is given by $\tau=l/\sqrt{2\kappa\omega}$.

In addition, the thermal capacitance, which also influences the time lag $\tau$, is given by $C_t=V\rho c$ where V is the volume of the object being heated; i.e., the volume of the resistive link and the volume of the encapsulating electrically insulating material being heated.

FIG. 4 illustrates the time dependence of the response signal $\Delta V(t)$ with respect to thermal stimulus P(t) in a time domain measurement. In this example, P(t) is modulated periodically "ON" and "OFF". The time delay $\tau$, shown in FIG. 4 increases as the resistive link is located deeper below a periodically heated surface as discussed above in conjunction with FIG. 3. The same reasoning applies to the current response signal $\Delta I_1(t)$ of Equation 6 since both $\Delta V(t)$ and $\Delta I_1(t)$ are proportional to thermal-resistive oscillations $\Delta R(t)$ of resistive link 10 as substantially represented by Equation 4.

The various embodiments to locate efficiently and accurately a circuit defect are now described. Given a workpiece such as a multi-chip module (MCM) having an area, i.e., search region, that is 128 mm by 128 mm. Assuming one circuit defect is to be located with accuracy 1 mm by 1 mm. Thus the search region contains 128*128 distinct locations. According to the example, a thermal stimulus is modulated at 100 Hz, and 10 cycles=0.1 sec are required to thermally stimulate one subset of locations and to measure the corresponding resistance change. For simplicity, this neglects the time to move from one subset to the next subset.

Figure 5:
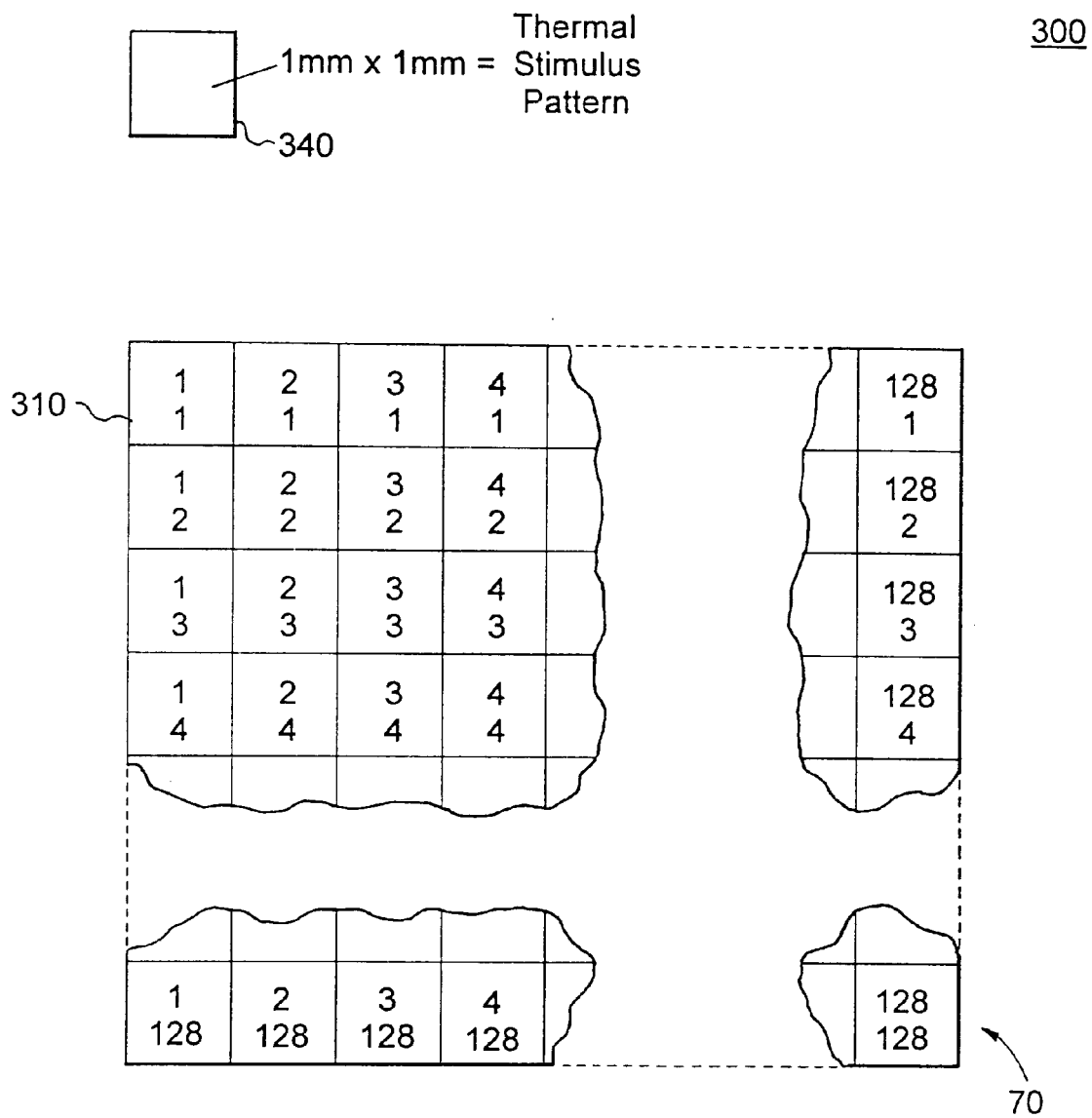
FIG. 5 is a first raster-type thermal stimulation and measurement technique to locate defects according to the invention.

According to a first embodiment 300 illustrated in FIG. 5, the thermal stimulus 340 is a small square pattern, e.g., 1 mm by 1 mm in area, which equals the spatial resolution. At each distinct location, this pattern of thermal stimulus is applied, and the corresponding resistance change is measured. This stimulation and measurement is applied in a raster pattern 310, including both horizontally and vertically motion. As shown in FIG. 5, the successive locations for thermal stimulus and measurement are labeled:

| (1, 1) | (2, 1) | (3, 1) | (4, 1) | ... | (128, 1) |
|---|---|---|---|---|---|
| (1, 2) | (2, 2) | (3, 2) | (4, 2) | ... | (128, 2) |
| (1, 3) | (2, 3) | (3, 3) | (4, 3) | ... | (128, 3) |
| ... | ... | ... | ... | ... | ... |
| (1,128) | (2,128) | (3,128) | (4,128) | ... | (128,128) |

This embodiment involves 128*128=1.64E4 measurements. Assuming a 0.1 sec/measurement, this requires 1.64E3 sec.

A more efficient method 400 is shown in the embodiment depicted in FIGS. 6(*a*) and 6(*b*). In FIG. 6(*a*), the thermal stimulus pattern 40 is a long and narrow rectangle, e.g., 1 mm by 128 mm, which is scanned horizontally across the workpiece, and measured at 128 positions. This embodiment continues with FIG. 6(*b*), where the thermal stimulus pattern 40' is a rectangle, e.g., 128 mm by 1 mm which is scanned vertically across the workpiece, and measured at 128 positions. For simplicity, suppose there is exactly one defect. One scan measures its horizontal position; the other scan measures its vetical position. Considering a circuit with exactly one defect, the two stimulus subsets which contain defects are logically combined by taking their intersection which will contain the defect. This embodiment requires 128+128=256 measurements=25.6 sec, which is very much faster than 1.64E3 sec required for the embodiment of FIG. 5.

FIGS. 7(*a*)–7(*d*) illustrates another embodiment 500 for expediently locating a circuit defect in two resolution stages. In FIG. 7(*a*), the thermal stimulus pattern 440 is a rectangle, e.g., 16 mm wide by 128 mm in height, and is scanned across workpiece at eight (8) positions, labeled X1.1 thru X1.8. Suppose the corresponding measurements indicate a defect only in subset X1.4. Then in FIG. 7(*b*), the thermal stimulus pattern 440' is a rectangle, e.g., 128 mm wide by 16 mm in height, which is additionally applied at eight (8) positions, labeled Y1.1 thru Y1.8. Suppose the corresponding measurements indicate the defect is in subset Y1.7. Thus, the workpiece 70 circuit has a single defect, i.e., located in an area defined by the intersection of X1.4 and Y1.7, which defect is in a refined search region which covers an area 450 of about 16 mm by 16 mm, such as shown in FIG. 7(*c*).

In the next stage of this embodiment, the thermal stimulus pattern is a smaller rectangle 460, e.g., 16 mm in height and 1 mm wide, which is applied at 16 positions, labeled X2.1 through X2.16, in the area 450 as shown in FIG. 7(*c*). Suppose the corresponding measurements indicate a defect only in X2.3. Finally, as shown in FIG. 7(*d*), an additional thermal stimulus pattern is a small rectangle, e.g., 16 mm wide by 1 mm in height, which is applied at 16 positions, labeled Y2.1 through Y2.16, in the area 450 of workpiece 70. Suppose the corresponding measurements indicate a defect only at Y2.6. Thus, in this example, the defect has been located at the intersection of X2.3 and Y2.6.

The embodiment depicted in FIGS. 7(*a*)–7(*d*) is expedient due to the fact that only 48 measurements (4.8 sec) are required.

As illustrated in FIGS. 7(*a*) and 7(*b*), a further embodiment combines scanning the workpiece 70 with a long narrow pattern such as provided with the stimulus 440, 440' (FIGS. 7(*a*)–7(*b*)) and scanning with a small spot thermal stimulus 340 such as provided with the stimulus 350 (FIG. 5). First, the stimulus 440, 440' as applied in FIGS. 7(*a*) and 7(*b*) is implemented to coarsely locate any defect, and thus refine the search region. Second, within this refined search region, a small spot thermal stimulus 340 (such as applied with respect to FIG. 5) is applied to individually stimulate and measure each possible defect location within the course region.

Thus, in FIGS. 7(*a*) and 7(*b*) a defect may be located within a crude resolution of 16 mm by 16 mm. In FIG. 7(*c*) and 7(*d*), this defect may be located with a fine resolution of 1 mm by 1 mm. One skilled in relevant arts can generalize to embodiments which use plural stages of resolution.

In an embodiment with plural stages of resolution, the system may provide plural means to apply thermal stimulus subsets. For example, although not shown in FIG. 7(*a*) and 7(*b*), a large infrared lamp with a large chopper and a large lens may be used, and for FIGS. 7(*c*) and 7(*d*) a much smaller lamp, chopper, and lens may be used. In the line and spot variation described above: for cruder line stage large linear components may be used; for the finer spot stage, small circular components may be used.

A more efficient method is the logical tree 600 method as shown in the embodiment depicted in FIGS. 8(*a*) and 8(*b*). In FIG. 8(*a*), the thermal stimulus is applied to two rectangular stimulus subsets, labeled X1.1 and X.1.2. Each subset covers half the original search region, so each covers ½ the area of the workpiece 70. In an example, the corresponding measurements indicate a defect only in stimulus subset X1.2. Therefore the search region is refined to X1.2. Within this region, the thermal stimulus is applied in two rectangular stimulus subsets, labeled Y1.1 and Y1.2, each covering half the refined search region, i.e., ¼ the area of the workpiece 70.

Suppose the corresponding measurements reveal a defect only in area Y1.2, as shown in FIG. 8(*a*). Thus the search region can again refined. This process can be iterated, as partially shown in FIG. 8(*b*) and leads to refined search regions, whose areas are ½, ¼, ⅛, ¹⁄₁₆, ¹⁄₃₂, ... of the original search region. To refine the search region down to 1 mm by 1 mm requires seven (7) quartets of rectangular subsets given that $128=2^7$ according to the following:

| (X1.1, X1.2, Y1.1, Y1.2) |
|---|
| (X2.1, X2.2, Y2.1, Y2.2) |
| ............... |
| (X7.1, X7.2, Y7.1, Y7.2) |

This embodiment requires only 28 measurements =2.8 sec. An important principal is to use stimulus subsets and measurements to iteratively refine the search region.

If all measurements are fully reliable, then this rapid embodiment still has some redundancy. For example, in view of FIG. 8(a), suppose X1.1 is defect free, X1.2 includes a defect, and Y.12 is defect free. Therefore, Y1.2 must include a defect. Thus measurement Y1.2 is redundant. In some cases, this enables locating a defect with even fewer measurements.

Figure 6A:
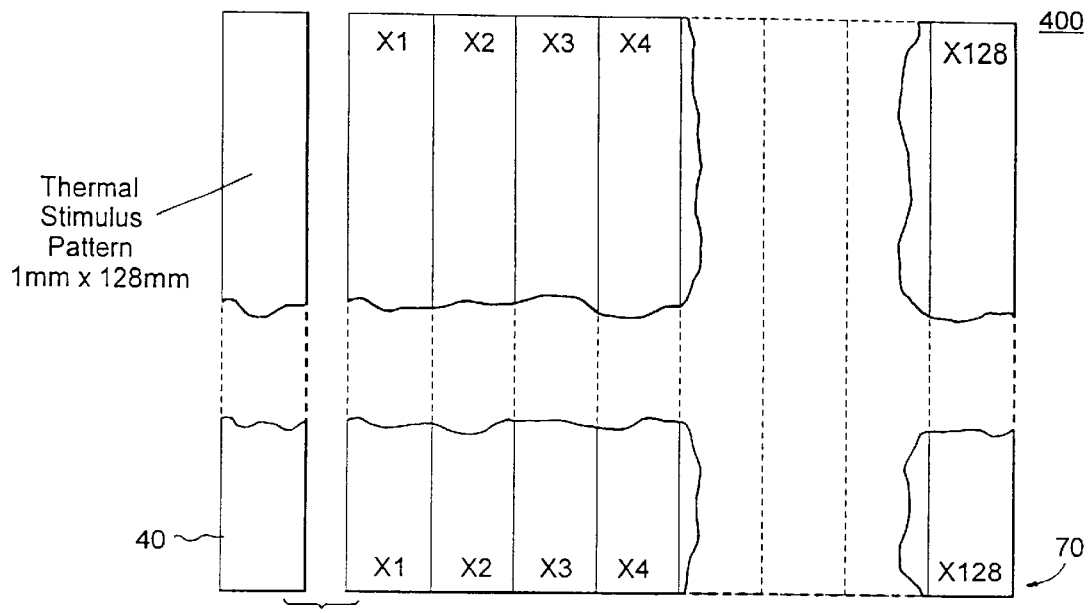
FIGS. 6(a) and 6(b) illustrate a faster raster-type thermal stimulation and measurement technique to locate defects along the x-direction (FIG. 6(a)) and the y-direction (FIG. 6(b)) of the workpiece according to the invention.
Figure 6B:
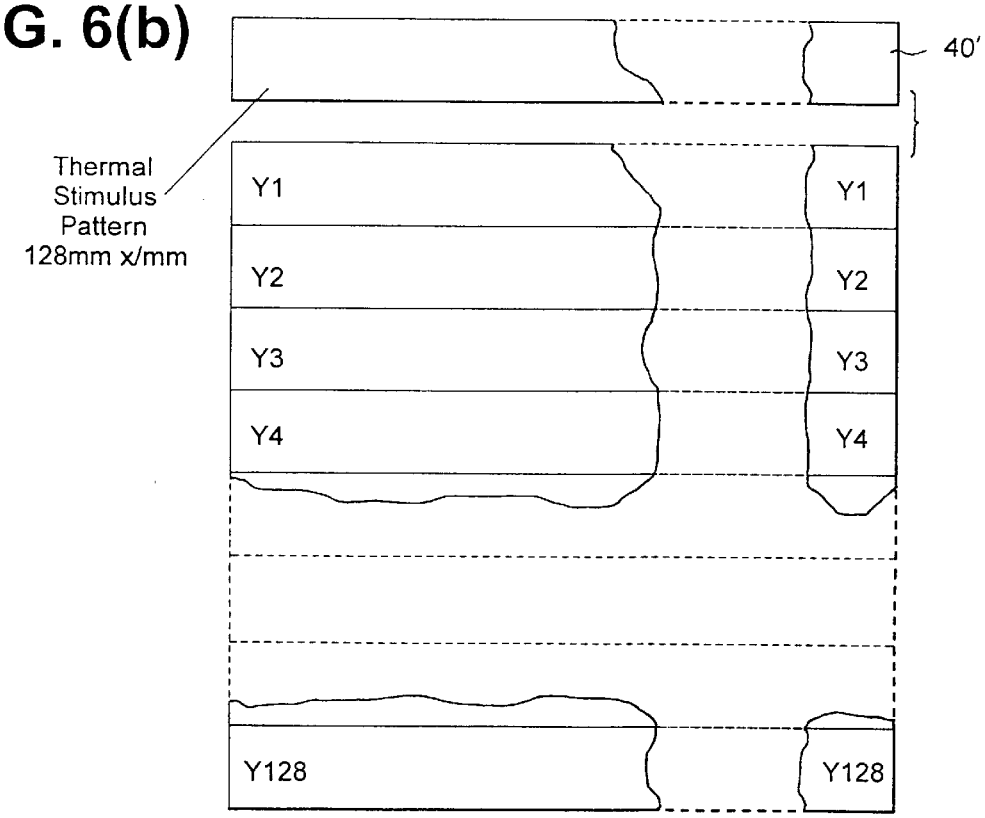
Figure 7A:
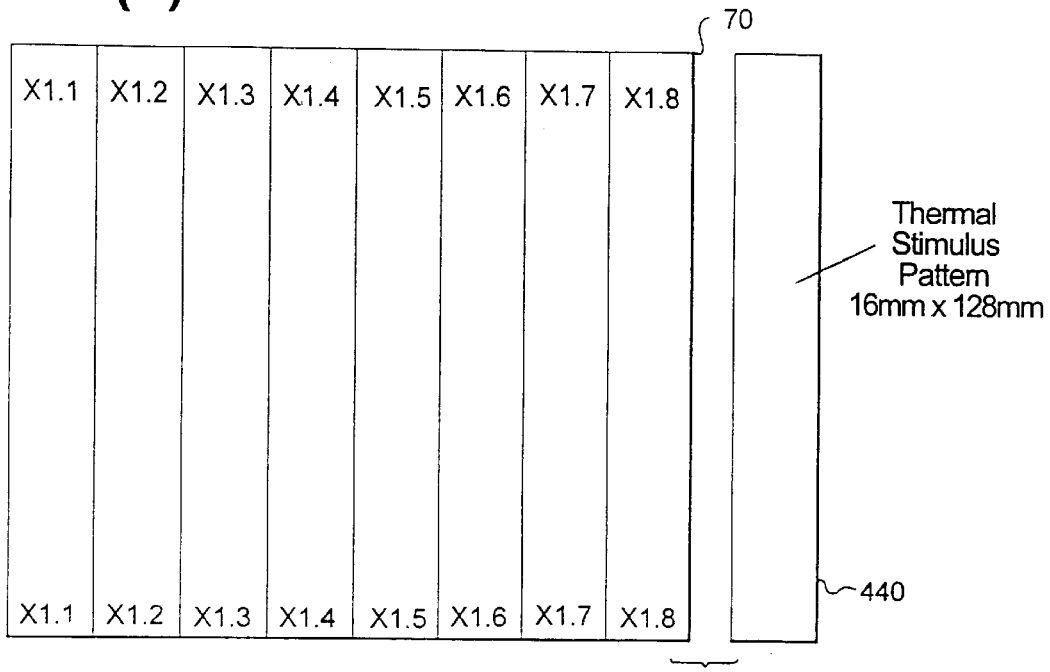
FIGS. 7(a) and 7(b) illustrate a coarse, low spatial resolution multi-resolution raster-type thermal stimulation and measurement technique to locate defects along the x-direction (FIG. 7(a)) and the y-direction (FIG. 7(b)) of the workpiece according to the invention.
Figure 7B:
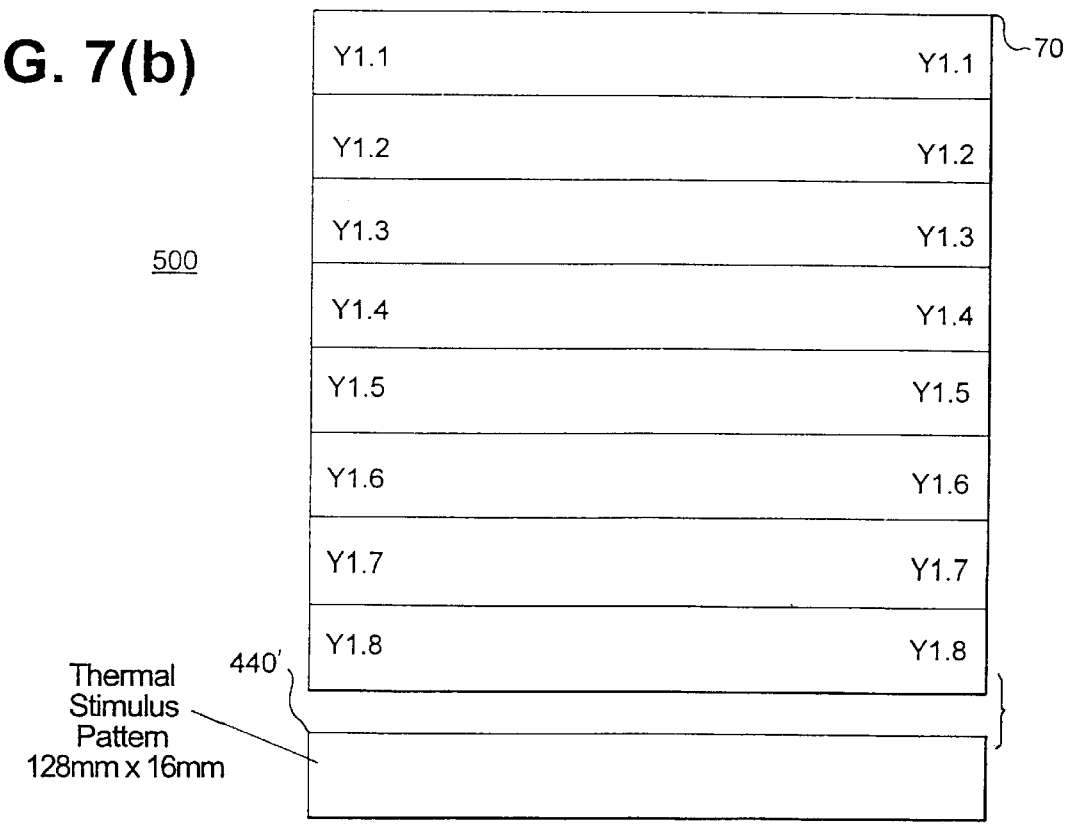
Figure 8A:
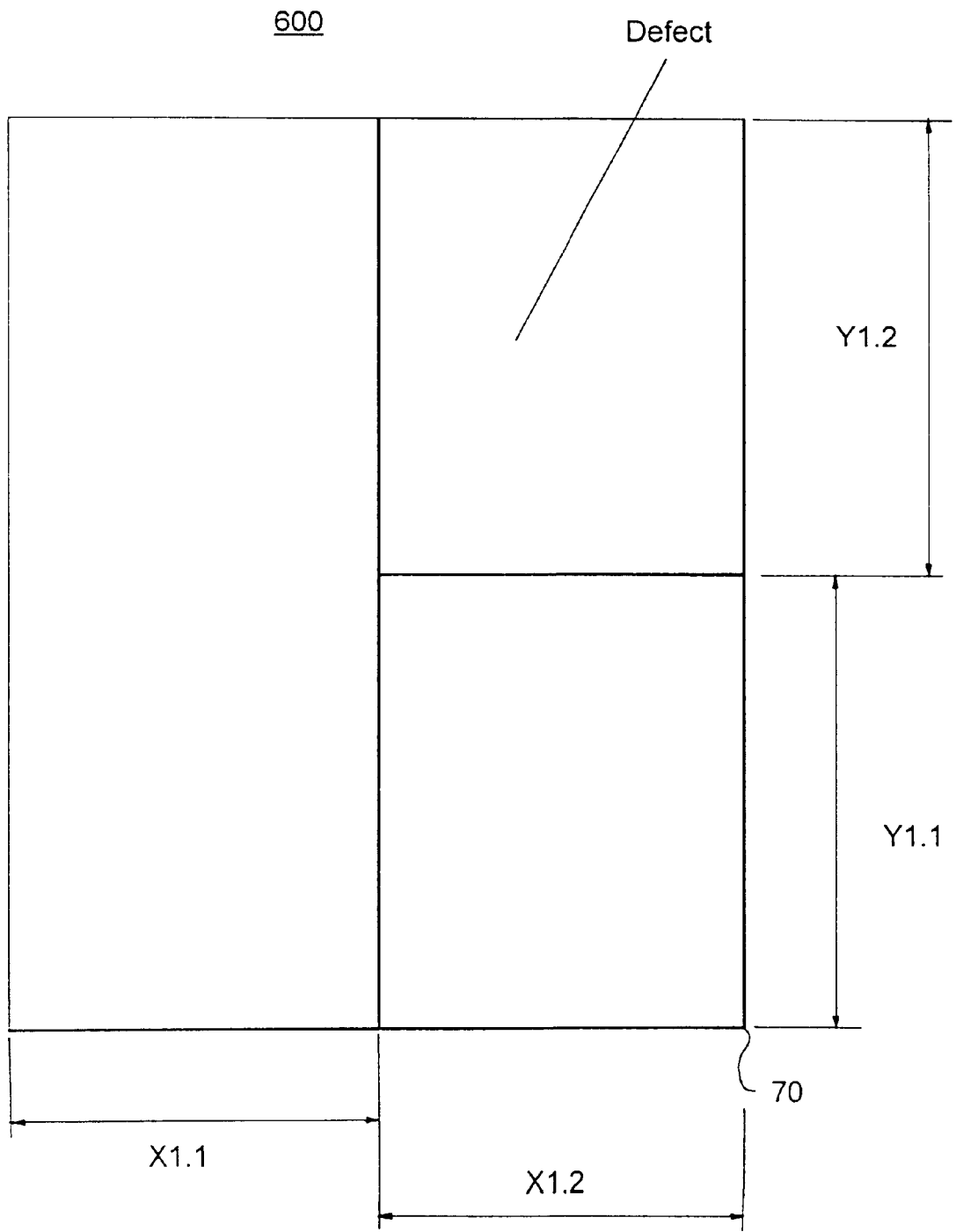
FIGS. 8(a) and 8(b) illustrate a logical-tree search thermal stimulation and measurement technique to locate defects of the workpiece according to the invention.
Figure 8B:
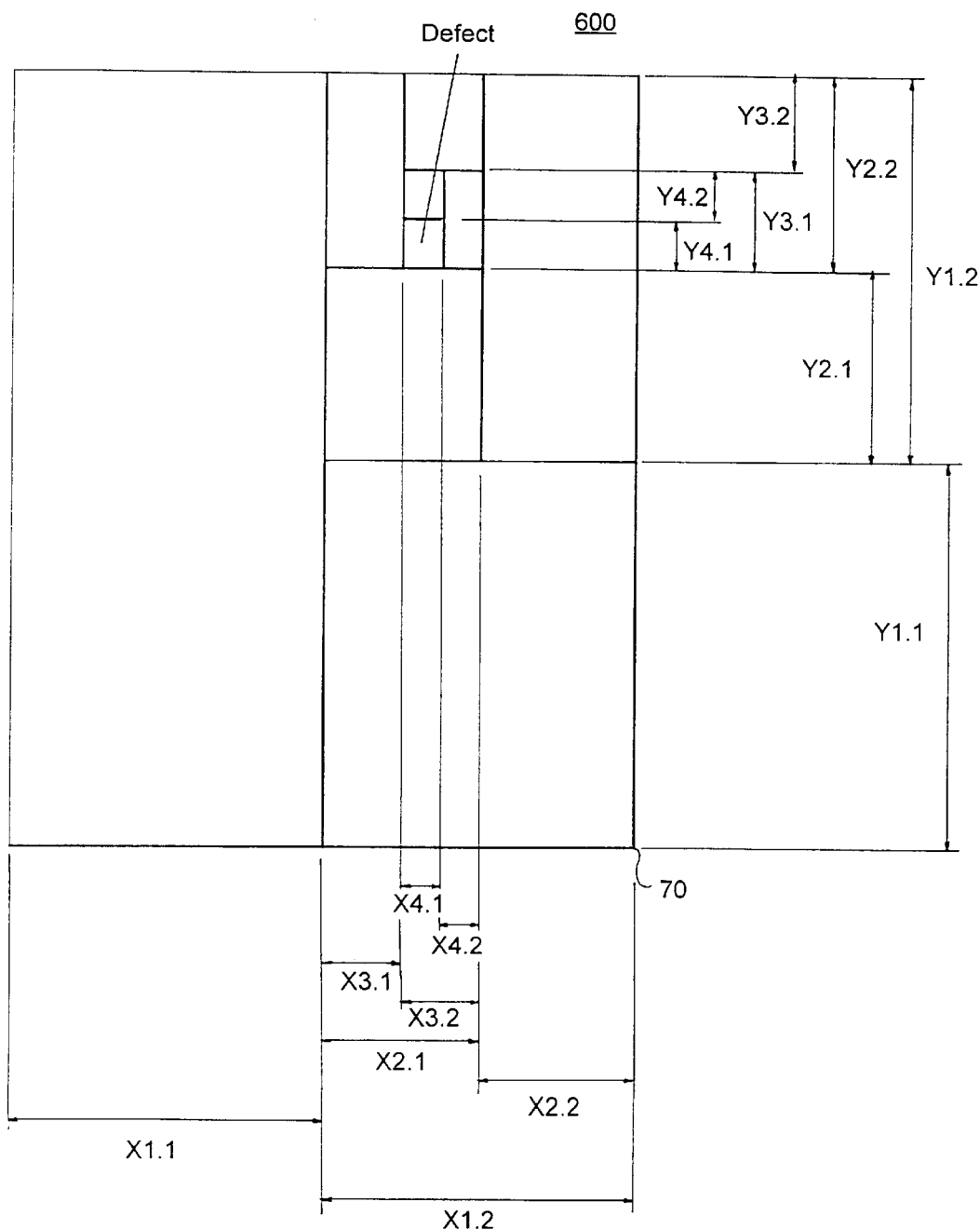

Referring back to FIG. 5, each stimulus subset includes exactly one possible location for a defect. In FIGS. 6(a) and 6(b), the stimulus subsets each include 128 possible locations. In FIGS. 7(a) and 7(b), the thermal stimulus subsets each include 16*128=2,048 possible locations for a defect. In FIGS. 8(a) and 8(b), stimulus subset included 64*128= 8,192 possible locations for a defect. Thus, a stimulation subset includes more than one possible location for a defect. This is important for rapidly locating a defect.

Figure 7C:
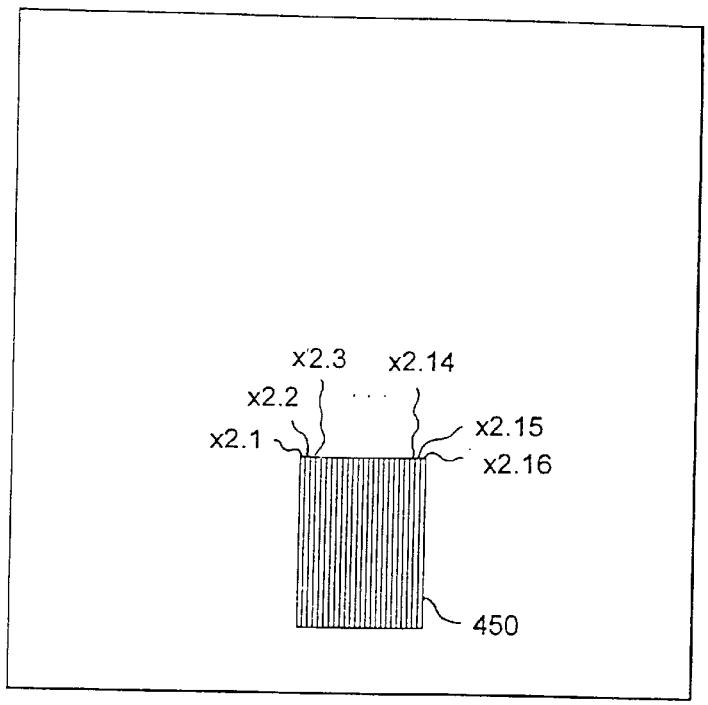
FIGS. 7(c) and 7(d) illustrate a refined, high spatial multi-resolution raster-type thermal stimulation and measurement technique to locate defects found by the coarse technique of FIGS. 7(a) and 7(b).
Figure 7D:
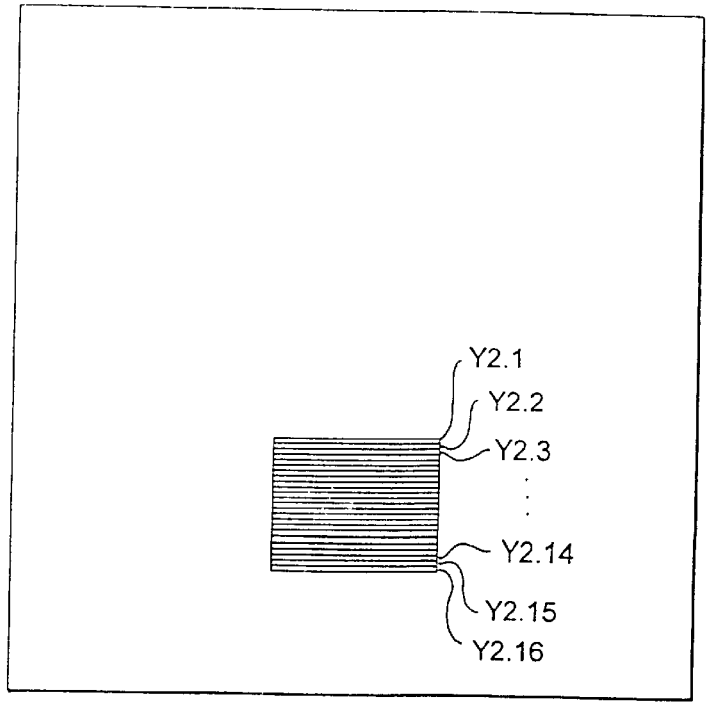

FIGS. 7(a)–7(d) further illustrates a sequence of stimulus subsets and corresponding measurements, with FIGS. 7(a) and 7(b) representing an earlier part of this sequence, and FIGS. 7(c) and 7(d) showing a later part of this sequence. In FIGS. 7(c) and 7(d), the positions of the stimulus subsets are designed according the refined search area implied by the stimulus subsets and measurements during FIGS. 7(a) and 7(b). Thus the later subsets are designed according to earlier stimulus subsets and corresponding measurements.

In FIGS. 6(a) and 6(b), each stimulus pattern is applied at 128 positions. In FIG. 6(a) and 6(b), each stimulus pattern is applied at 8 positions. In FIG. 7(c) and 7(d), each stimulus pattern is applied at 16 positions. By contrast, the original search region has 128*128=1,638 possible locations. In FIG. 8(a) and 8(b), the pattern X1 is applied at two positions X1.1 and X1.2. Thus, in these cases, a stimulus pattern which includes more than one possible defect location is applied at relatively few positions compared to the number of possible defect locations in the search region.

Some workpieces have many more locations, which changes the relative speed of locating defects according to these embodiments. For example, a large PCB may be 300 mm by 300 mm, and require 1 mm location resolution of 1 mm by 1 mm. In such cases, cases, the raster-type scanning embodiment of FIG. 5 becomes unreasonable, while the scanning in X, Y dimensions in the embodiment of FIGS. 6(a) and 6(b) may be tolerable. However, the multi-resolution embodiment described with respect to FIGS. 7(a)–7(d) and the logical tree embodiment (FIGS. 8(a) and 8(b) are the most efficient.

More generally, in raster search, the number of measurements scales approximately with the number of locations in the original search region. In XY dimension search, the number of measurements scales approximately as the sum of length and width of the search region. Compared to a corresponding search with constant resolution, a search with N stages of resolution may be designed to reduce the number of measurements by approximately the Nth root. Likewise, a tree search may be designed to reduce the number of measurements by approximately the logarithm.

This invention may be utilized to improve upon the above—cited prior art reference of Halperin, Distefano and Chiang, which describes a technique utilizing homodyne and heterodyne methods to detect defects with electric non-linearity.

In an example, a thermal stimulus modulated at frequency $F_{stimulus}$ is applied to the workpiece 70. The circuit itself is driven with a current source at frequency $F_{drive}$. The corresponding voltage is measured at frequency $F_{measure}$ which has been chosen to highlight the non-linear circuit defect:

$$F_{measure} = 2 * F_{Drive} + F_{Stimulus}$$

In an example of the invention illustrating a heterodyning technique, a circuit is driven with a current source which includes two frequencies $F_{drive1}$ and $F_{drive2}$. The measurement frequency is chosen as follows:

$$F_{measure} = F_{drive1} + F_{drive2} + F_{stimulus}$$

In these frequency formulas, the frequencies may be positive or zero. Additionally, various harmonic ratios for homodyne or heterodyne modulation may be used.

During electrochemical fabrication of a printed circuit, there may exist an unintended "haze layer" which is electrically conductive or resistive and cause many short defects in parallel between two otherwise distinct circuit elements. For detecting the location of circuit defects in a haze layer requires a specialized embodiment as the parallelism exhibited may mask the effect of thermal stimulation applied to just one short defect. Instead, thermal stimulus is applied throughout a substantial area, to simultaneously change many shorts within the area. In the most extreme case, the thermal stimulus subset includes the entire workpiece. This will cause a more significant resistance change in circuit resistance. Thus, one can readily measure the delay between stimulus and resistance change. This indicates the layer depth, which suggest its origin during fabrication.

In general, the thermal stimulus power is proportional to the area being stimulated. Some cases require a large area, such as stimulus subset X1.1 in FIG. 8(a), or the stimulus subset for a haze layer. This may require considerable power, which may become a problem. Alternatively, less power density but longer stimulation times may be used. Measurement of this resistance change may be enhanced by "signal averaging". For example, use a lock-in amplifier for data acquisition (DA) shown in FIG. 1 or FIG. 2.

From these embodiments, one skilled in relevant arts may readily generalize to further embodiments, e.g., implementing various other patterns for thermal stimulus, various numbers of subsets, or various numbers of stages of resolution. Additionally, although the embodiments described herein have been directed to idealized stimulus subsets, with sharply defined edges, it should be understood that, in some cases, the stimulus subset may have significantly fuzzy edges. In those cases, subsets which partly overlap may be implemented. Further, although the embodiments described herein have been directed to cases whereby a defect may be measured reliably, it should be understood that some measurements are imperfect. Thus, additional stimulus subsets to repeatedly measure each defect may be required.

While the invention has been particularly shown and described with respect to illustrative and preformed embodiments thereof, it will be understood by those skilled in the art that the foregoing and other changes in form and detail may be made therein without departing from the spirit and scope of the invention which should be limited only by the scope of the appended claims.

Having thus described our invention, what we claim as new, and desire to secure the Letters Patent is:

1. A system for locating a defect in a workpiece comprising an electric circuit having at least one defect, said system comprising:

device for applying a thermal stimulus to one or more spatial subsets defining an area of said workpiece, said thermal stimulation being applied to affect an efficient search pattern so as to locate defects in the electric circuit;

device for measuring a corresponding electric response of said electric circuit after each application of said thermal stimulation at a spatial subset area, a response indicating presence or absence of a circuit defect; and mechanism for locating said defect in said circuit by logically combining those spatial subset areas having produced a corresponding measurement indicating presence of a circuit defect.

2. The system as claimed in claim 1, wherein said workpiece is defined as comprising a small number of large spatial subset areas allowing for coarse localization of said defect, said device for applying said thermal stimulus enabling initial application of thermal stimulus at large spatial subset areas.

3. The system as claimed in claim 2, wherein after course localization of said defect within a large spatial subset area, said device for applying said thermal stimulus enabling application of thermal stimulus at a number of smaller spatial subset areas defined within said large spatial subset area, said measuring of a corresponding electric response of said electric circuit occurring after each application of said thermal stimulation in said smaller subset areas, whereby a small number of measurements is required to locate said defect as compared to a total number of possible spatial subset area.

4. The system as claimed in claim 1, wherein said electric circuit included in said workpiece does not include semiconductor integrated circuit devices.

5. The system as claimed in claim 1, wherein said electric circuit includes only passive electric circuit devices without amplifier devices, said electric circuit operating passively during said stimulation and measurement.

6. The system as claimed in claim 1, wherein said defect is one of: a short circuit defect or an incipient open circuit defect.

7. The system as claimed in claim 1, wherein said device for measuring a corresponding electric response of said electric circuit includes is characterized as having an internal impedance determined in accordance with an impedance of said circuit defect.

8. The system as claimed in claim 1, further including device for applying an electric stimulus to said circuit during application of said thermal stimulus, said measured response comprising a signal having characteristics attributed to both said applied electric and thermal stimulus.

9. The system as claimed in claim 8, wherein both said electric stimulus and thermal stimulus are time-modulated, said measured response comprising an intermodulated electric signal.

10. The system as claimed in claim 1, wherein said thermal stimulus applied to said one or more spatial subsets is time-modulated, said device for measuring a corresponding electric response of said electric circuit including measuring a delay and phase of said response compared to said stimulus, said delay and phase response indicating a depth of said defect in said electric circuit.

11. A method for locating a defect in a workpiece comprising an electric circuit having at least one defect, said method comprising the steps of:

a) applying a thermal stimulus to one or more spatial subsets defining an area of said workpiece, said thermal stimulation being applied to affect an efficient search pattern so as to locate defects in the electric circuit;

b) measuring a corresponding electric response of said electric circuit after each application of said thermal stimulation at a spatial subset area, a response indicating presence or absence of a circuit defect; and c) logically combining those spatial subset areas having produced a corresponding measurement indicating presence of a circuit defect to thereby locate said defect in said circuit.

12. The method as claimed in claim 11, wherein said workpiece is defined as comprising a small number of large spatial subset areas allowing for coarse localization of said defect, said applying step a) including initially applying said thermal stimulus at large spatial subset areas.

13. The method as claimed in claim 12, wherein after coarse localization of said defect within a large spatial subset area, the step of: applying said thermal stimulus at a number of smaller spatial subset areas defined within said large spatial subset area, said measuring of a corresponding electric response of said electric circuit occurring after each application of said thermal stimulation in said smaller subset areas, whereby a small number of measurements are required to locate said defect as compared to a total number of possible spatial subset areas.

14. The method as claimed in claim 11, wherein said defect is one of: a short circuit defect or an incipient open circuit defect.

15. The method as claimed in claim 11, further including the step of applying an electric stimulus to said circuit during application of said thermal stimulus, said measured response corresponding to said applied electric and thermal stimulus.

16. The method as claimed in claim 15, wherein both said electric stimulus and thermal stimulus are time-modulated, said measured response comprising an intermodulated electric signal.

17. The method as claimed in claim 11, wherein said thermal stimulus applied to said one or more spatial subsets is time-modulated, said measuring step further including the step of: measuring a delay and phase of said response compared to said stimulus, and determining a depth of said defect in said electric circuit based on said measured delay and phase response.

* * * * *